United States Patent
George et al.

(10) Patent No.: US 12,401,187 B2
(45) Date of Patent: Aug. 26, 2025

(54) DETECTING AN ELECTRICAL FAULT WITHIN A MONITORED ZONE OF A POWER TRANSMISSION LINE

(71) Applicant: Hitachi Energy Ltd, Zürich (CH)

(72) Inventors: Neethu George, Karnataka (IN); Od Naidu, Karnataka (IN)

(73) Assignee: HITACHI ENERGY LTD, Zürich (CH)

( * ) Notice: Subject to any disclaimer, the term of this patent is extended or adjusted under 35 U.S.C. 154(b) by 462 days.

(21) Appl. No.: 17/908,859

(22) PCT Filed: Mar. 1, 2021

(86) PCT No.: PCT/EP2021/055071
§ 371 (c)(1),
(2) Date: Sep. 1, 2022

(87) PCT Pub. No.: WO2021/175793
PCT Pub. Date: Sep. 10, 2021

(65) Prior Publication Data
US 2023/0094978 A1     Mar. 30, 2023

(30) Foreign Application Priority Data

Mar. 2, 2020  (IN) .............................. 202041008792

(51) Int. Cl.
*H02H 7/26*     (2006.01)
*G01R 31/58*    (2020.01)

(52) U.S. Cl.
CPC .............. *H02H 7/26* (2013.01); *G01R 31/58* (2020.01)

(58) Field of Classification Search
CPC ... H02H 7/26; H02H 3/44; H02H 3/40; G01R 31/58; Y04S 10/52
(Continued)

(56) References Cited

U.S. PATENT DOCUMENTS 4,203,142 A * 5/1980 Lee ........................ G01R 27/18
361/87
5,453,903 A   9/1995 Chow
(Continued)

FOREIGN PATENT DOCUMENTS

CN    1262802 A     8/2000
CN    102195275 A   9/2011
(Continued)

OTHER PUBLICATIONS

International Search Report and Written Opinion of the International Searching Authority for the corresponding PCT Application No. PCT/EP2021/055071 dated May 31, 2021, 13 pages.

*Primary Examiner* — Dharti H Patel
(74) *Attorney, Agent, or Firm* — Procopio, Cory, Hargreaves & Savitch LLP

(57) ABSTRACT

Examples for protecting a power transmission line in response to a fault occurring within a monitored zone in a power transmission system are described. In an example, an occurrence of the fault in at least one phase of the power transmission line may be identified. Thereafter, an actual rate of change of incremental current is calculated based on calculated incremental currents. With the actual rate of change determined, a threshold for rate of change of incremental current is calculated based on calculated incremental voltages, the calculated incremental currents, line parameters, and a zone setting for the monitored zone. Based on comparison of the actual rate of change and the threshold for the rate of change, the fault is determined to have occurred in the monitored zone. Thereafter, a trip signal may be generated for controlling a switching device associated with the power transmission line.

20 Claims, 8 Drawing Sheets

(58) Field of Classification Search
USPC .......................................................... 361/42
See application file for complete search history.

(56) References Cited

U.S. PATENT DOCUMENTS

| | | | | | |
|---|---|---|---|---|---|
| 5,847,913 | A | * | 12/1998 | Turner | G01R 31/52 361/115 |
| 6,625,550 | B1 | * | 9/2003 | Scott | H01H 71/125 361/87 |
| 6,947,273 | B2 | * | 9/2005 | Bassett | G06F 1/26 361/111 |
| 8,749,933 | B2 | * | 6/2014 | Berggren | H02H 7/268 361/65 |
| 11,660,978 | B2 | * | 5/2023 | Douglass | B60L 3/04 361/104 |
| 2004/0066593 | A1 | * | 4/2004 | Kolker | G01R 31/52 361/42 |
| 2004/0263183 | A1 | * | 12/2004 | Naidu | G01R 31/52 324/536 |
| 2009/0021878 | A1 | * | 1/2009 | Saha | G01R 31/52 361/81 |
| 2011/0013324 | A1 | * | 1/2011 | Hyde | H02H 7/26 361/54 |
| 2012/0004869 | A1 | * | 1/2012 | Saarinen | G01R 31/3274 702/59 |
| 2013/0107405 | A1 | | 5/2013 | Blumschein et al. | |
| 2015/0162741 | A1 | * | 6/2015 | Valdes | H02H 7/262 361/87 |
| 2016/0077149 | A1 | * | 3/2016 | Schweitzer, III | G01R 31/08 307/131 |
| 2016/0149389 | A1 | * | 5/2016 | Schroeder | H02H 1/0092 361/93.2 |
| 2019/0004103 | A1 | * | 1/2019 | Liu | G01R 31/52 |

FOREIGN PATENT DOCUMENTS

| | | |
|---|---|---|
| CN | 102842890 A | 12/2012 |
| CN | 106199329 A | 12/2016 |
| CN | 107576840 A | 1/2018 |
| CN | 109066608 A | 12/2018 |
| EP | 0577228 A1 | 1/1994 |
| JP | H0614447 A | 1/1994 |
| JP | 2002311076 A | 10/2002 |
| JP | 2011078292 A | 4/2011 |

* cited by examiner

DETECTING AN ELECTRICAL FAULT WITHIN A MONITORED ZONE OF A POWER TRANSMISSION LINE

CROSS-REFERENCE TO RELATED APPLICATIONS

The present application is a national stage entry of International Patent App. No. PCT/EP2021/055071, filed on Mar. 1, 2021, which claims priority to Indian Patent Application number 202041008792, filed on Mar. 2, 2020, which are both hereby incorporated herein by reference in their entireties.

TECHNICAL FIELD

The present subject matter relates, in general, to power transmission systems. More specifically, the present subject matter relates to approaches for detection of faults within a monitored zone of a power transmission line.

BACKGROUND

Short circuit faults occurring in the transmission line is one of the hazardous phenomena in power systems. Such faults, when they occur, have to be detected and cleared as soon as possible. If the faults are not cleared or addressed within the critical clearing time, the faults may cause the power transmission system to lose transient stability, which in turn may lead to a blackout. A distance relay coupled to an Intelligent Electronic Device (IED) may be utilized to provide protection of transmission lines against such faults. As would be understood, the IED may monitor the impedance during its operation. When the impedance monitored by the IED is less than predefined threshold the distance relay may be activated to ensure protection against the fault. Since the distance relays act in response to the detection of a fault, it may be understood, that speed of the conventional distance relay depends on the accuracy of phasor estimation during transmission line fault conditions.

BRIEF DESCRIPTION OF DRAWINGS

The features, aspects, and advantages of the present subject matter will be better understood with regards to the following description and accompanying figures. The use of the same reference number in different figures indicate similar or identical features and components.

It may be noted that throughout the drawings, identical reference numbers designate similar, but not necessarily identical, elements. The figures are not necessarily to scale, and the size of some parts may be exaggerated to more clearly illustrate the example shown.

Figure 1:
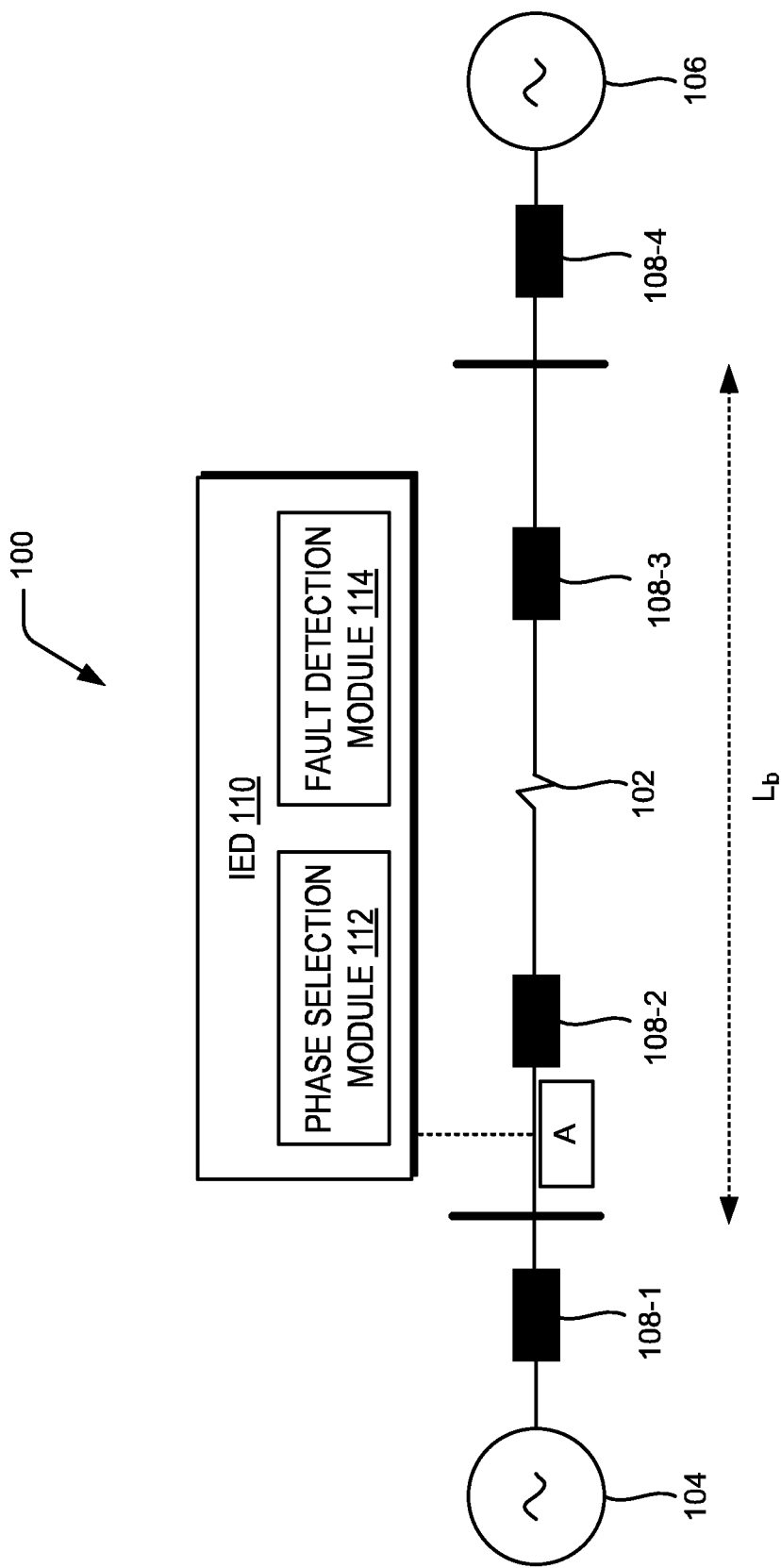
FIG. 1 provides an illustration depicting an electrical network having an intelligent electronic device, as per one example.

Moreover, the drawings provide examples and/or implementations consistent with the description; however, the description is not limited to the examples and/or implementations provided in the drawings.

DETAILED DESCRIPTION

Electrical fault may be considered as deviation of voltages and/or currents values which may occur due to external or internal changes in an electrical network. Under normal operating conditions, electrical network equipment in transmission lines carry normal voltages and currents and operate within their normal operating parameters. However, during occurrence of electrical faults, as a result of which excessively high currents may flow through such network equipment. This may cause damage to equipment and devices within the electrical network. Many preventive measures are conventionally implemented to safeguard the electrical network. In one such example, when the impedance drops below a predefined value, an IED may cause a distance relay to detect the fault and accordingly generates a trip command for a switching device, such as a circuit breaker, to trip to prevent any damages that may result from the impedance drops experienced in the electrical network. Faults may be broadly categorized asymmetric and symmetric faults. Asymmetrical fault is a condition in which load in a three-phase power supply becomes unequal on all the three phases of the transmission line. On the other hand, symmetrical faults or balanced faults may be considered as such faults which impact each of the three-phases of the electrical network equally and at the same time. Examples of such symmetric faults include, but are not limited to, line-to-line-to-line (L-L-L), line-to-line-to line-to ground (L-L-L-G).

One of the techniques employed for detection of a fault and/or protection of the transmission line from these faults, involves an approach which is commonly known as the distance protection method. In such cases, a short circuit on a transmission line may be detected based on measurement of short-circuit impedance. To this end, the protection devices, such as an IED, may measure the impedance up until the fault location. Based on this, a further determination may be made to ascertain whether the fault in fact occurs within the transmission line, or a zone, which is to be protected by the protection device. If it is ascertained that the short circuit that has occurred lies on the line to be protected, the line in question is disconnected and the faulty network portion is separated from the system.

As would also be understood, power transmission may include power generation from one or more sources. Presently, power generation may also involve renewable source of power which may tend to reduce inertia and transient stability margin of the electrical network. Owing to the effect on the stability, high-speed protection is necessary. Conventional techniques for high-speed protection are based on certain time domain protection principles. Such technique may further employ high sampling rates and processing power for high-speed line protection. Such approaches generally have been able to reduce fault detection times, depending on the fault location and source-to-line impedance ratio. However, considering that the involvements of such renewable sources within the electrical network will only increase, approaches for quicker detection of faults is therefore desired.

Approaches for detecting occurrence of electrical faults which may have occurred within a monitored zone of a power transmission line, are described. In an example, an occurrence of the fault in at least one phase of the power transmission line may be initially identified. Continuing further, an actual rate of change of incremental current and incremental voltage based on calculated incremental currents and voltages is determined. The incremental currents are such that they correspond to the difference in currents. In a similar way, incremental voltages may be considered as values which correspond to difference in voltages. The currents and the voltages, in the present example, are measured at the terminals of the power transmission line.

With the actual rate of change of incremental current determined, a threshold for the rate of change of incremental current may be further determined. The threshold for the rate of change of the incremental current may be understood as the rate of change of such incremental current assuming that a fault has occurred at the zone boundary. The threshold for the rate of change of the incremental current then forms the basis for ascertaining whether the fault under consideration is occurred in the zone boundary or not. In an example, the threshold for the rate of change of incremental current may be calculated based on the calculated incremental voltages, the calculated incremental currents, line parameters, and a zone setting for the monitored zone. It may be noted that other parameters may also be utilized for calculating the threshold for the rate of change of incremental current. Zone setting (reach setting) is the setting which determines the reach of protection, i.e. the zone expected to be covered by the protection, and beyond which the protection will not operate. This can be in terms of percentage of transmission line length or impedance.

Thereafter, a further determination may be made to ascertain whether the fault may have occurred within a monitored zone. A monitored zone may be considered as a portion of the power transmission line which is monitored by an Intelligent Electronic Device (IED). In an example, the determination may be based on a comparison of the actual rate of change of the incremental current and the threshold for the rate of change of the incremental current. For example, the actual rate of change of the incremental current being greater than the threshold of the rate of change of the incremental current is indicative of a fault. On the other hand, if the actual rate of change of incremental current is less than the threshold for the rate of change of incremental current, it may be concluded that the fault may have occurred beyond the monitored zone. On determining that the fault has occurred within the monitored zone, a trip signal for controlling a switching device, such as a circuit breaker, associated with the power transmission line may be generated.

The approaches as described also enable determining whether fault occurs within reach and should be rectified within less time as compared to conventional approaches, thereby preventing any adverse impact of faults, for example, such as those which arise due to current transformer saturation. It has also been observed that a power transmission system implementing the present subject matter is able to detect and remain stable in situations of occurrence of faults during power swing conditions. The manner in which the above-mentioned steps may be differ across various example, without any deviation to the scope of protection which has been sought. These and other aspects are further described in detail in conjunction with the accompanying FIGS. 1-5.

FIG. 1 provides a block diagram of an equivalent electrical network 100, as per an example. The electrical network 100 comprises transmission line 102 and two-electrical sources, namely sources 104, 106. The transmission line 102 is further provided with one or more switching device(s) 108-1, 2, 3, 4, ..., N (collectively referred to as switching device(s) 108). The switching device(s) 108 allow opening of the circuit to restrict the flow of excess current in the electrical network during fault condition. It may be noted that the electrical network 100 as depicted is only illustrative. The electrical network 100 may include further components without deviating from the scope of the present subject matter.

The electrical network 100 is further installed with an intelligent electronic device 110 (referred to as the IED 110). The IED 110 may be in electrical communication with the transmission lines 102 either directly or through other connecting means. The IED 110, during operation, may receive and monitor measurements from one or more measurement devices. Examples of such measurement devices include, but are not limited to, current transformers and voltage transformers. Based on the measurements data received, the IED 110 may generate one or more signals to control the switching device(s) 108, as explained in the following paragraphs.

The IED 110 further includes a phase selection module 112 and fault detection module 114. The phase selection module 112 and fault detection module 114 may be implemented as either software installed within the IED 110, or as hardware in the form of electronic circuitry integrated within the circuitry of the IED 110. The present example is described considering that the electrical network 100 is experiencing an electrical fault. The present subject matter is capable of detecting occurrence of such faults within a monitored zone, when the IED 110 is placed at terminal A within the transmission line 102 such that current signals from the measurement devices may be obtained. It may be noted that the IED 110 may also be adapted to determine the occurrence of a power swing without deviating from the scope of the present subject matter.

In operation, the phase selection module 112 determines occurrence of fault within a particular phase of the transmission lines 102. The manner in which the phase, in which the fault has occurred, may be determined is further explained in conjunction with other figures. Once the phase in which the fault has occurred is determined, the IED 110 may further determine whether the fault has occurred within the monitored zone of the transmission lines 102. In an example, the fault detection module 114 may determine whether the fault has occurred within the monitored zone.

To such an end, the fault detection module 114 may determine values of currents and voltages at the terminal of the transmission lines 102. Based on the current values and the voltage values, the fault detection module 114 may further determine incremental currents based on the changes in the currents measured at the terminals. In a similar manner, the incremental voltages, based on the changes in the voltages may also be determined.

Once the above-mentioned incremental values are determined, the fault detection module 114 may further calculate an actual rate of change of incremental current (referred to as the actual rate of change, for sake of brevity) based on the determined incremental currents. Thereafter, the fault detection module 114 may further calculate a threshold for the rate of change of the incremental current (referred to as threshold for the rate of change, for sake of brevity). In an example, the threshold for the rate of change of incremental current may be calculated based on the calculated incremental voltages, the calculated incremental currents, and line parameters (e.g., resistance or inductance) corresponding to the transmission lines 102 present within the monitored zone.

As also described previously, the threshold for the rate of change may be considered as the rate of change of incremental current which would be present assuming that a fault is to have occurred at the zone boundary. In an example, the zone boundary may be a length which is a portion of the length of the transmission lines 102. In another example, the zone boundary may be defined as occurring at about 80% of the length of the transmission lines 102. It may be noted that the present example defining the length at which the zone boundary is present is only indicative. Any other measure defining where the zone boundary is located may be used without deviating from the scope of the present subject matter.

Returning to the present example, once the actual rate of change and the threshold for the rate of change of the incremental currents are obtained, the fault detection module 114 may further process the same to obtain a processed actual rate of change and a processed threshold for the rate of change of the incremental currents. In an example, the fault detection module 114 may calculate a root-mean-square values of the actual rate of change and the threshold for the rate of change to provide the processed actual rate of change and the processed threshold for the rate of change.

The fault detection module 114 may then subsequently assess whether the fault has occurred within the zone boundary based on the processed actual rate of change and the processed threshold for the rate of change. For example, the fault detection module 114 may compare the processed actual rate of change and the processed threshold for the rate of change. If the processed actual rate of change is less than the processed threshold for the rate of change, the fault detection module 114 may indicate that the fault has occurred beyond the monitored zone boundary. However, if the processed actual rate of change is greater than the processed threshold rate of change, the fault detection module 114 may accordingly indicate that the fault has occurred within the monitored zone boundary.

On determining the occurrence of fault within the monitored zone boundary, the fault detection module 114 may further generate one or more trip signals fora switching device(s) 108, e.g., a circuit breaker, which may be coupled to the transmission lines 102 under consideration. Based on the trip signals, the switching device(s) 108 may get activated to isolate the fault which has occurred within the monitored zone boundary. These and other examples are further described in conjunction with FIG. 2.

Figure 2:
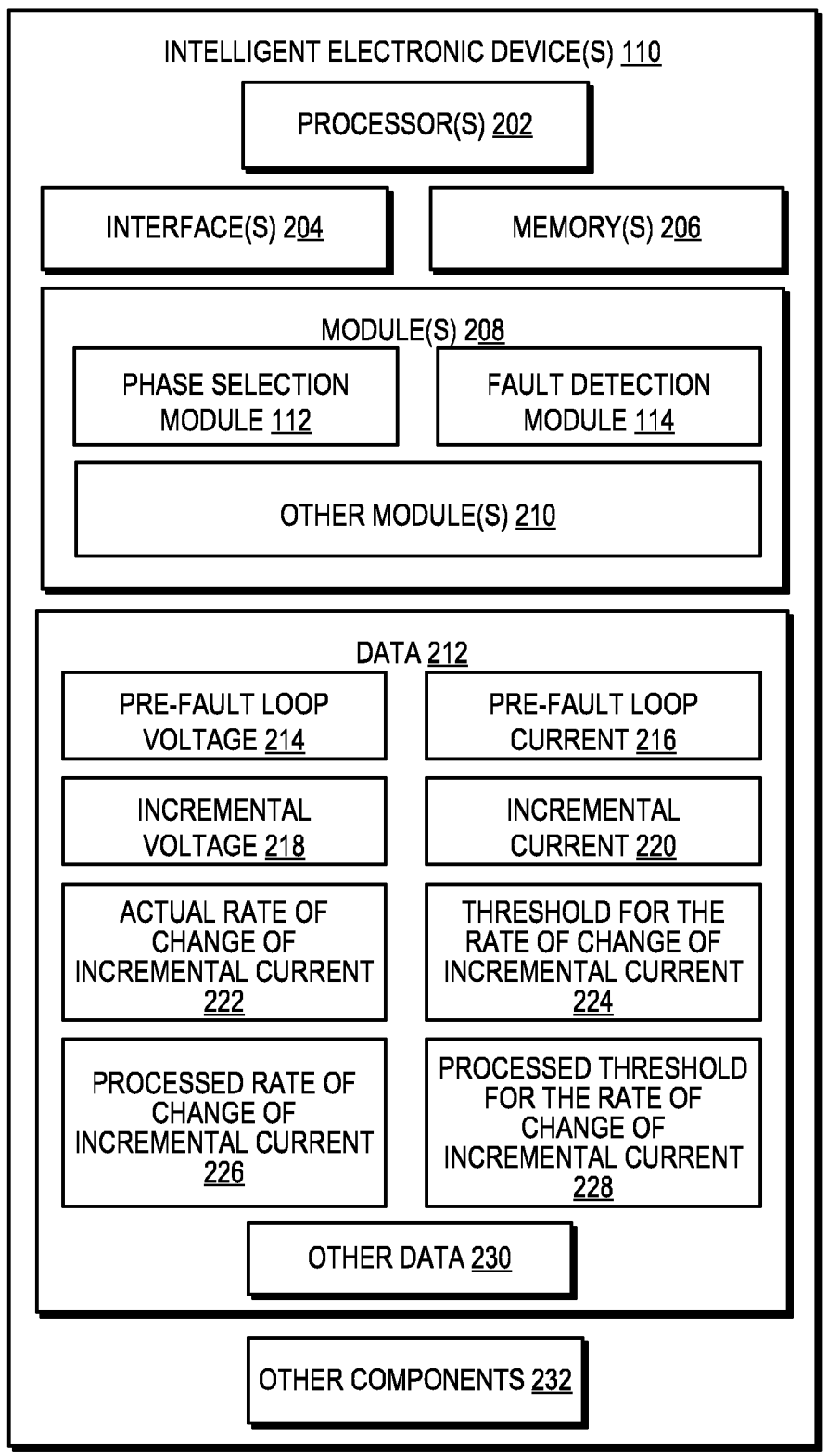
FIG. 2 provides a block diagram of an example intelligent electronic device, as per one example.

FIG. 2 provides a block diagram of an intelligent electronic device (IED) 110, as per one example. The IED 110 includes processor(s) 202, interface(s) 204 and a memory(s) 206. The processor(s) 202 may be a single processing unit or may include a number of units, all of which could include multiple computing units. The processor(s) 202 may be implemented as one or more microprocessor, microcomputers, digital signal processors, central processing units, state machines, logic circuitries, and/or any devices that manipulate signals based on operational instructions. Among other capabilities the processor(s) 202 are adapted to fetch and execute processor-readable instructions stored in the memory 206 to implement one or more functionalities.

The interface(s) 204 may include a variety of software and hardware enabled interfaces. The interface(s) 204 may enable the communication and connectivity between the IED 110 and other components of the electrical network 100. Examples of such components include, but is not limited to, switching device(s) 108 and sensors. The interface(s) 204 may facilitate multiple communications within a wide variety of protocols and may also enable communication with one or more computer enabled terminals or similar network components.

The memory(s) 206 may be coupled to the processor(s) 202. The memory(s) 206 may include any computer-readable medium known in the art including, for example, volatile memory, such as Static Random-Access Memory (SRAM) and Dynamic Random-Access Memory (DRAM), and/or non-volatile memory, such as Read Only Memory (ROM), Erasable Programmable ROMs (EPROMs), flash memories, hard disks, optical disks, and magnetic tapes.

The IED 110 may further include one or more module(s) 208. The module(s) 208 may be implemented as a combination of hardware and programming (for example, programmable instructions) to implement a variety of functionalities of the module(s) 208. In examples described herein, such combinations of hardware and programming may be implemented in several different ways. For example, the programming for the module(s) 208 may be executable instructions. Such instructions in turn may be stored on a non-transitory machine-readable storage medium which may be coupled either directly with the IED 110 or indirectly (for example, through networked means). In example implemented as a hardware, the module(s) 208 may include a processing resource (for example, either a single processor or a combination of multiple processors), to execute such instructions. In the present examples, the processor-readable storage medium may store instructions that, when executed by the processing resource, implement module(s) 208. In other examples, module(s) 208 may be implemented by electronic circuitry.

The data 212 includes data that is either stored or generated as a result of functionalities implemented by any of the module(s) 208. It may be further noted that information stored and available in data 212 may be utilized for detecting the zone within which the fault is to have occurred. In an example, the module(s) 208 include phase selection module 112, fault detection module 114 and other module(s) 210. The other module(s) 210 may implement functionalities that supplement applications or functions performed by the IED 110 or any of the module(s) 208. The data 212 on the other hand may include pre-fault loop voltage 214, a pre-fault loop current 216, an incremental voltage 218, an incremental current 220, an actual rate of change of incremental current 222, a threshold for the rate of change of incremental current 224, a processed rate of change of incremental current 226, a processed threshold for the rate of change of incremental current 228 and other data 230. In addition, the IED 110 may further include other component(s) 232. Such other component(s) 232 may include a variety of other electrical components that enable functionalities of managing and controlling the operation of the electrical network 100. Examples of such other component(s) 232 include, but is not limited to, relays, controllers, switches and voltage regulators.

Figure 3:
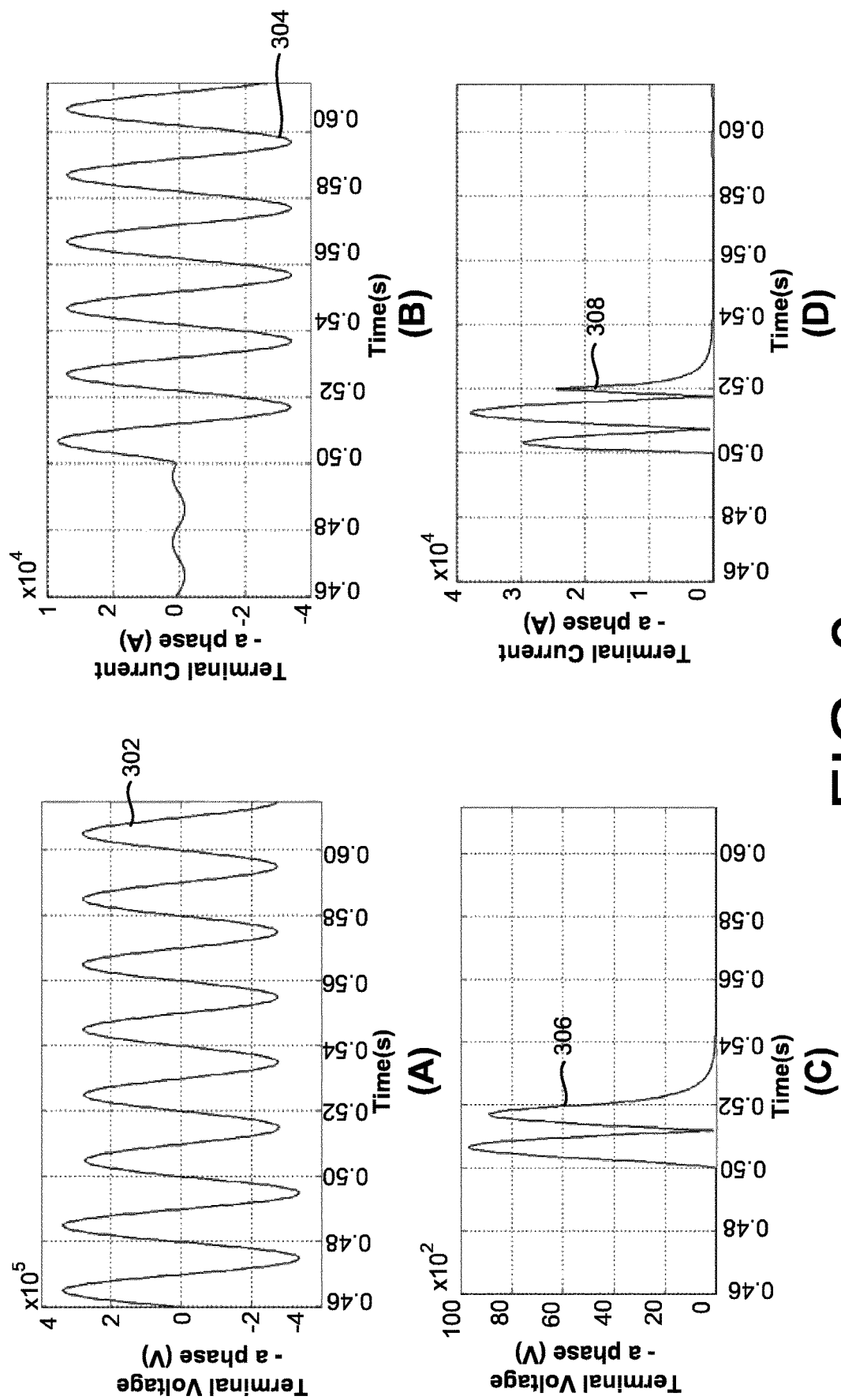
FIGS. 3-7 provides illustrative graphs depicting occurrence of a three-phase fault within a monitored zone of a power transmission line, the instantaneous values of current and voltage, and corresponding incremental current and incremental voltage, as per one example.
Figure 4:
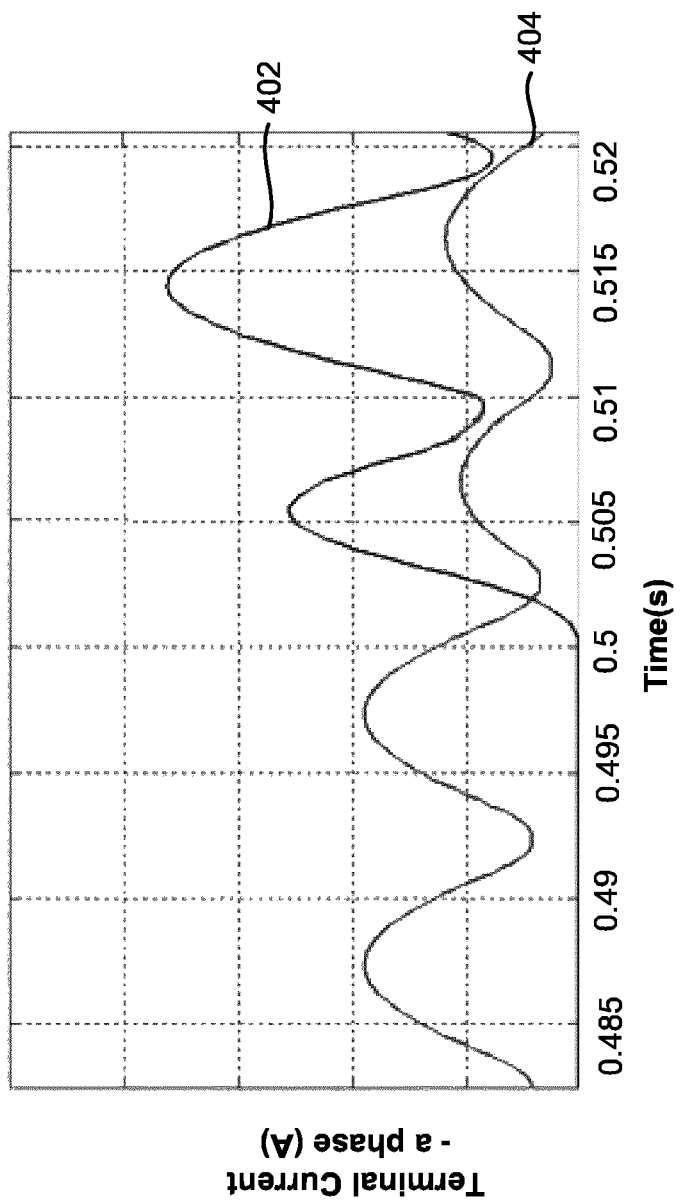

The IED 110 detects occurrence of an electrical fault within a monitored zone of a power transmission line within the electrical network, such as electrical network 100. The operation of the IED 110 is further described in conjunction with FIGS. 3-4. FIG. 3-4 provides a series of illustrative graphs depicting the electric current waveforms. It may be noted that the waveforms thus depicted are only indicative and may be pertinent to the present example. The waveforms may differ slightly depending on the implementation.

Returning to the present example, the IED 110 may be connected with one or more measurement devices installed within the electrical network 100 through interface(s) 204. As mentioned previously, examples of such measurement devices include a current transformer or a voltage transformer. In operation, the phase selection module 112 may monitor the current and voltage measurements corresponding to the three-phase electric current that is being transmitted within the electrical network 100, to identify the phase in which a fault has occurred.

In an example, while monitoring a flow of electric current within the electrical network 100, a phase selection module 112 is to determine a state of a start-up signal. Based on the state of the start-up signal the phase selection step may be initiated. In an example, the phase selection module 112 may process the three-phase input currents. Further, the phase selection module 112 may determine phase-phase quantities by calculating a moving average of the input currents for each phase. Based on the moving average of the input currents, the phase selection module 112 may determine one or more phase-phase quantities based on which the start-up signal may be generated. The moving average and the phase-phase quantities may be determined based on the equations 1-6, as indicated below:

$$i_{Ast}^{a}(k) = \frac{1}{N}\sum_{i=(k-N+1)}^{k} i_{A}^{a}(i) \tag{1}$$

$$i_{Ast}^{b}(k) = \frac{1}{N}\sum_{i=(k-N+1)}^{k} i_{A}^{b}(i) \tag{2}$$

$$i_{Ast}^{c}(k) = \frac{1}{N}\sum_{i=(k-N+1)}^{k} i_{A}^{c}(i) \tag{3}$$

$$i_{Ast}^{ab}(k) = i_{Ast}^{a}(k) - i_{Ast}^{b}(k) \tag{4}$$

$$i_{Ast}^{bc}(k) = i_{Ast}^{b}(k) - i_{Ast}^{c}(k) \tag{5}$$

$$i_{Ast}^{ca}(k) = i_{Ast}^{c}(k) - i_{Ast}^{a}(k) \tag{6}$$

where, $i_{Ast}^{a}$; $i_{Ast}^{b}$, $i_{Ast}^{c}$, $i_{Ast}^{ab}$, $i_{Ast}^{bc}$ and $i_{Ast}^{ca}$ are the instantaneous samples of currents;
k is the current sample; and
N is the number of samples per power cycle.

In one example, the magnitude of instantaneous samples of currents $i_{Ast}^{a}$, $i_{Ast}^{b}$, $i_{Ast}^{c}$, $i_{Ast}^{ab}$, $i_{Ast}^{bc}$ and $i_{Ast}^{ca}$ are compared against a threshold $i^{th}$. In one example, the threshold $i^{th}$ may be 0.01. If the phase selection module 112 determines any of the currents $i_{Ast}^{a}$, $i_{Ast}^{b}$, $i_{Ast}^{c}$, $i_{Ast}^{ab}$, $i_{Ast}^{bc}$ and $i_{Ast}^{ca}$ to be greater than a threshold $i^{th}$ a phase-selection start-up signal may be generated.

Once the phase-selection start-up signal is generated, the fault detection module 114 may further calculate a value of the incremental currents. In an example, the incremental quantity of an electrical signal at any instant is defined as, the difference between instantaneous magnitude of the signal at an instant and the magnitude of the same signal at such an instance in a previous power cycle. In one example, incremental quantity is calculated for phase currents as well as phase-phase currents, which is based on the following equations:

$$\Delta i_{A}^{a}(k) = i_{A}^{a}(k) - i_{A}^{a}(k-N) \tag{7}$$

$$\Delta i_{A}^{b}(k) = i_{A}^{b}(k) - i_{A}^{b}(k-N) \tag{8}$$

$$\Delta i_{A}^{c}(k) = \Delta i_{A}^{c}(k) - \Delta i_{A}^{c}(k-N) \tag{9}$$

$$\Delta i_{A}^{ab}(k) = \Delta i_{A}^{a}(k) - \Delta i_{A}^{b}(k) \tag{10}$$

$$\Delta i_{A}^{bc}(k) = \Delta i_{A}^{b}(k) - \Delta i_{A}^{c}(k) \tag{11}$$

$$\Delta i_{A}^{ca}(k) = \Delta i_{A}^{c}(k) - \Delta i_{A}^{a}(k) \tag{12}$$

Where, $i_{A}^{p}(k)$ is $k^{th}$ sample of the secondary current signal at terminal A, and where p stands for the corresponding phase, $p \in (a, b, c)$;
$i_{A}^{p}(k-N)$ is $(k-N)^{th}$ sample of the current signal measured at terminal A, $p \in (a, b, c)$;
N is the number of samples in one power cycle;
$\Delta i_{A}^{p}(k)$ is the $k^{th}$ sample of incremental quantity of phase current, $p \in (a, b, c)$; and
$\Delta i_{A}^{pp}(k)$ is the $k^{th}$ sample of incremental quantity of phase current, $pp \in (ab, bc, ca)$ Once the incremental quantities of different current signals, i.e., incremental currents have been obtained, the phase selection module 112 may further process the same. In an example, the phase selection module 112 may obtain incremental currents using a moving average filter. In one example, the pre-processing is obtained using one or more passes. In first pass, the incremental quantities is passed through a moving average filter of one power cycle window to obtain a first absolute value, $\Delta i_{Ama1}^{p}(k)$, which is based upon equation:

$$\Delta i_{Ama1}^{p}(k) = \left|\frac{1}{N}\sum_{j=k-N+1}^{k} \Delta i_{A}^{p}(j)\right|, \; p \in (a, b, c, ab, bc, ca) \tag{13}$$

Where, N is the number of samples in one power cycle
$\Delta i_{Ama1}^{p}(k)$ is $k^{th}$ sample of output of first moving average filter, $p \in (a, b, c, ab, bc, ca)$ In second pass, the output of the first moving average filter may be passed through a second moving average filter of half power cycle window and is to obtain second absolute value, $\Delta i_{Ama2}^{p}(k)$ which is based upon equation:

$$\Delta i_{Ama2}^{p}(k) = \left|\frac{1}{N/2}\sum_{j=k-N/2+1}^{k} \Delta i_{Ama1}^{p}(j)\right|, \tag{14}$$

$$p \in (a, b, c, ab, bc, ca)$$

Where, N is the number of samples in one power cycle
$\Delta i_{Ama2}^{p}(k)$ is $k^{th}$ sample of output of second moving average filter, $p \in (a, b, c, ab, bc, ca)$ Once the processing has been performed, the phase selection module 112 identifies a fault loop, such that maximum and minimum among phase and phase-phase quantities are identified for each sample. In one example, the maximum and minimum among phase and phase-phase quantities identified for each sample, is based on following equations: For maximum and minimum current values among phase quantities:

$$\Delta i_{max}^{pg}(k) = \max(\Delta i_{Ama2}^{a}(k), \Delta i_{Ama2}^{b}(k), \Delta i_{Ama2}^{c}(k)) \tag{15}$$

$$\Delta i_{min}^{pg}(k) = \min(\Delta i_{Ama2}^{a}(k), \Delta i_{Ama2}^{b}(k), \Delta i_{Ama2}^{c}(k)) \tag{16}$$

For maximum and minimum current values among phase-phase quantities:

$$\Delta i_{max}^{pp}(k) = \min(\Delta i_{Ama2}^{ab}(k), \Delta i_{Ama2}^{bc}(k), \Delta i_{Ama2}^{ca}(k)) \tag{17}$$

$$\Delta i_{min}^{pp}(k) = \min(\Delta i_{Ama2}^{ab}(k), \Delta i_{Ama2}^{bc}(k), \Delta i_{Ama2}^{ca}(k)) \tag{18}$$

In one example, the fault within the loop may correspond to a single-phase fault or phase-phase (i.e., three phase) fault. For determining type of fault, a comparison may be made between the determined absolute value and a pre-determined value (i.e., E which in one example is set as 0.001). To such an end, the phase selection module 112 may define a counter value. In one example, the magnitude of instantaneous samples of currents (i.e. $|\Delta i_{Ama2}{}^{ab}(k)|$, $|\Delta i_{Ama2}{}^{bc}(k)|$, $|\Delta i_{Ama2}{}^{ca}(k)|$) for each sample is compared with a predefined parameter E. Based on the comparison, the phase selection module 112 may increment the counter value. Once the counter value exceeds a predefined threshold, either a single-phase fault or a three-phase fault may be identified.

The above approach is described in conjunction with the following example. In the present example, six counters are defined corresponding to each phase or a phase-phase loops. For example, Counter A, B and C may correspond to phases a, b and c. Further exemplary Counters AB, BC, CA may be defined, wherein such respective counters correspond to ab, bc, and ca phases. The manner in which each of the Counters A, B, C, AB, BC, CA are incremented may be determined based on the following equations as explained below:

Increment counter A if:

$$\Delta i_{max}{}^{pg}(k) = |\Delta i_{Ama2}{}^{a}(k)| \tag{19}$$

$$\Delta i_{min}{}^{pp}(k) = |\Delta i_{Ama2}{}^{bc}(k)| \tag{20}$$

$$|\Delta i_{Ama2}{}^{bc}(k)| \leq \varepsilon \tag{21}$$

Increment Counter B if:

$$\Delta i_{max}{}^{pg}(k) = |\Delta i_{Ama2}{}^{b}(k)| \tag{22}$$

$$\Delta i_{min}{}^{pp}(k) = |\Delta i_{Ama2}{}^{ca}(k)| \tag{23}$$

$$|\Delta i_{Ama2}{}^{ab}(k)| \leq \varepsilon \tag{24}$$

Increment Counter C if:

$$\Delta i_{max}{}^{pg}(k) = |\Delta i_{Ama2}{}^{c}(k)| \tag{25}$$

$$\Delta i_{min}{}^{pp}(k) = |\Delta i_{Ama2}{}^{ab}(k)| \tag{26}$$

$$|\Delta i_{Ama2}{}^{ab}(k)| \leq \varepsilon \tag{27}$$

Increment Counter AB if:

$$\Delta i_{min}{}^{pg}(k) = |\Delta i_{Ama2}{}^{c}(k)| \tag{28}$$

$$\Delta i_{max}{}^{pp}(k) = |\Delta i_{Ama2}{}^{ab}(k)| \tag{29}$$

Increment Counter BC if:

$$\Delta i_{min}{}^{pg}(k) = |\Delta i_{Ama2}{}^{c}(k)| \tag{30}$$

$$\Delta i_{max}{}^{pp}(k) = |\Delta i_{Ama2}{}^{ab}(k)| \tag{31}$$

Increment Counter CA if:

$$\Delta i_{min}{}^{pg}(k) = |\Delta i_{Ama2}{}^{c}(k)| \tag{32}$$

$$\Delta i_{max}{}^{pp}(k) = |\Delta i_{Ama2}{}^{ab}(k)| \tag{33}$$

If each of the $|\Delta i_{Ama2}{}^{ab}(k)|$, $|\Delta i_{Ama2}{}^{bc}(k)|$, $|\Delta i_{Ama2}{}^{ca}(k)|$) is less than $\varepsilon$, the phase selection module 112 may determine occurrence of a single phase fault. Thereafter, the phase selection module 112 may further determine to check if any of the Counters A, B, or C may have reached a predefined counter limit, to determine in which phase, i.e. phases a, b, c, has the fault occurred. For example, if Counter A reaches a predefined counter limit (say, 10), the phase selection module 112 may determine that a single-phase fault has occurred in phase a. In a similar manner, the occurrence of single-phase fault, i.e., a line fault, may be determined by the phase selection module 112 in either phases b or c depending on the counter which reaches the predefined counter limit, and thereafter, may generate a trip signal for the corresponding phase.

If each of the $|\Delta i_{Ama2}{}^{ab}(k)|$, $|\Delta i_{Ama2}{}^{bc}(k)|$, $|\Delta i_{Ama2}{}^{ca}(k)|$) is greater than $\varepsilon$, the phase selection module 112 may determine occurrence of a phase-phase fault or a three-phase fault. For example, in case any of the Counters AB, BC, or CA reaches the predefined counter limit, the phase selection module 112 may conclude that a phase-phase fault or a three-phase fault has occurred in the corresponding phase-phase loop and accordingly may generate a trip signal. It may be noted that the above example is only illustrative and is not the only process to identify phases in which the faults have occurred. Other examples for detecting the occurrence of a fault may also be utilized without deviating from the scope of the present subject matter.

Post detecting the occurrence of a fault, the fault detection module 114 may ascertain whether the fault in the transmission lines 102 has occurred within the monitored zone boundary or not. In an example, the fault detection module 114 receives a measurement of the pre-fault loop voltage 214 and a pre-fault loop current 216. The fault detection module 114 may further obtain currents and voltages, by measuring the same at the terminals of the transmission lines 102. In an example, the waveforms 302 and 304, depicting the measured voltages and currents, respectively, in one example, as depicted in FIGS. 3A-3B. Further, the fault detection module 114 also receives a measurement of an incremental voltage 218 and incremental current 220, wherein the incremental voltage 218 and the incremental current 220 correspond to difference in voltage and current, respectively, measured during the fault and/or measured prior to occurrence of the fault, which is based on the following equation:

$$\Delta i_k = (i_k - i_{k-N}) \tag{34}$$

$$\Delta v_k = (v_k - v_{k-N}) \tag{35}$$

wherein:
$\Delta i_k$ is the incremental current;
$\Delta v_k$ is the incremental voltage;
k is the current sample; and
N is the number of samples in one cycle.

It may be noted that the above equation is only illustrative with the first set being determined through other mechanisms as well.

Waveforms corresponding to the incremental voltage 218 and the incremental current 220 are further depicted in FIGS. 3C-3D, respectively. FIGS. 3C-3D are illustrative graphs depicting the incremental voltage 218 and incremental current 220, as waveforms 306, 308. It may also be noted that the depicted graphs are only indicative, and corresponds to one of the many other examples, which also fall within the scope of the present subject matter. Once the incremental voltage 218 and the incremental current 220 are determined, the fault detection module 114 also processes the pre-fault loop voltage 214, the pre-fault loop current 216, the incremental voltage 218, and the incremental current 220 in order to reduce noise to provide processed values for pre-fault loop voltage, pre-fault loop current, incremental voltage and incremental current. The pre-processing performed by the fault detection module 114 may be performed for smoothening the samples in order to isolate errors that may have been caused due to noise or any other unwanted components.

In an example, the pre-processing may be performed by the fault detection module 114 based on the following equations:

$$\Delta v_{ipma}(k) = \frac{1}{3} \sum_{i=-1}^{1} \Delta v_{ip}(k-i) \tag{36}$$

-continued $$\Delta i_{lplma}(k) = \frac{1}{3}\sum_{i=-1}^{1} \Delta i_{lpl}(k-i) \quad (37)$$

$$\Delta i_{lprma}(k) = \frac{1}{3}\sum_{i=-1}^{1} \Delta i_{lpr}(k-i) \quad (38)$$

$$v_{ma}^{pre}(k) = \frac{1}{3}\sum_{i=-1}^{1} v^{pre}(k-i) \quad (39)$$

$$i_{ma}^{pre}(k) = \frac{1}{3}\sum_{i=-1}^{1} i^{pre}(k-i), \quad (40)$$

wherein $\Delta v_{lpma}$ being the processed incremental voltage;

$\Delta i_{lplma}$ being the processed incremental current across an inductive component of the transmission line;

$\Delta i_{lprma}$ being the processed incremental current across a resistive component of the transmission line;

$v_{ma}^{pre}$ being the processed pre-fault loop voltage; and $i_{ma}^{pre}$ being the processed pre-fault loop current.

Once the aforementioned values are obtained, the fault detection module 114 calculates an actual rate of change of incremental current 222 based on the processed incremental current. The value of actual rate of change of incremental current 222 may be calculated based on the following equation:

$$d\Delta i_{act}(k) = \frac{(\Delta i_{lplma}(k) - \Delta i_{lplma}(k-1))}{(\Delta t)} \quad (41)$$

wherein, $\Delta t$ is a time difference in seconds.

In addition to the above, the fault detection module 114 may also calculates the threshold for the rate of change of incremental current 224 based on the processed incremental voltage, processed incremental current and the voltage measured at a boundary (i.e. at boundary A of the transmission line 102) of the monitored zone prior to the occurrence of the fault. In one example, the threshold for the rate of change of incremental current is calculated based on the following equation:

$$\Delta i_{thr}(k) = \frac{\Delta v_{lpma}(k) - R_1 * z_b * \Delta i_{lprma}(k) + v_{z1}^{pre}(k)}{L_1 * z_b} \quad (42)$$

wherein $z_b$ denotes the boundary of the monitored zone, and wherein $R_1$, $L_1$ are positive-sequence series resistance and inductance of the transmission line.

Post calculations, the fault detection module 114 determines the root-mean-square value of the rate of change of the incremental current 222 and the threshold for the rate of change of incremental current 224 to provide a processed rate of change of incremental current 226 and a processed threshold for the rate of change of incremental current 228, which may be represented as:

$$d\Delta i_{act}^{rms} = \sqrt{\frac{\sum_{k=0}^{\frac{N}{3}} (d\Delta i_{act}(k-i))^2}{\frac{N}{3}}} \quad (43)$$

$$d\Delta i_{thr}^{rms} = \sqrt{\frac{\sum_{k=0}^{N/3} (d\Delta i_{thr}(k-i))^2}{N/3}} \quad (44)$$

wherein $d\Delta i_{act}^{rms}$ depicts the processed rate of change of the current; and $d\Delta i_{thr}^{rms}$ depicts the processed threshold for the rate of change of incremental current.

Thereafter, the fault detection module 114 further determines whether the fault is to have occurred in the monitored zone based on a comparison between the processed rate of change of the incremental current 226 and the processed threshold for the rate of change of incremental current 228. In one example, when the processed rate of change of the incremental current 226 is greater than the processed threshold for the rate of change of incremental current 228, the fault detection module 114 identifies occurrence of the fault within the monitored zone. Conversely, when the processed rate of change of the incremental current 226 is lesser than the processed threshold for the rate of change of incremental current 228, the fault detection module 114 indicates occurrence of the fault outside the monitored zone. The waveforms 402, 404 pertaining comparison between the processed rate of change of the incremental current 226 and the processed threshold for the rate of change of incremental current 228 is shown in FIG. 4.

Figure 5:
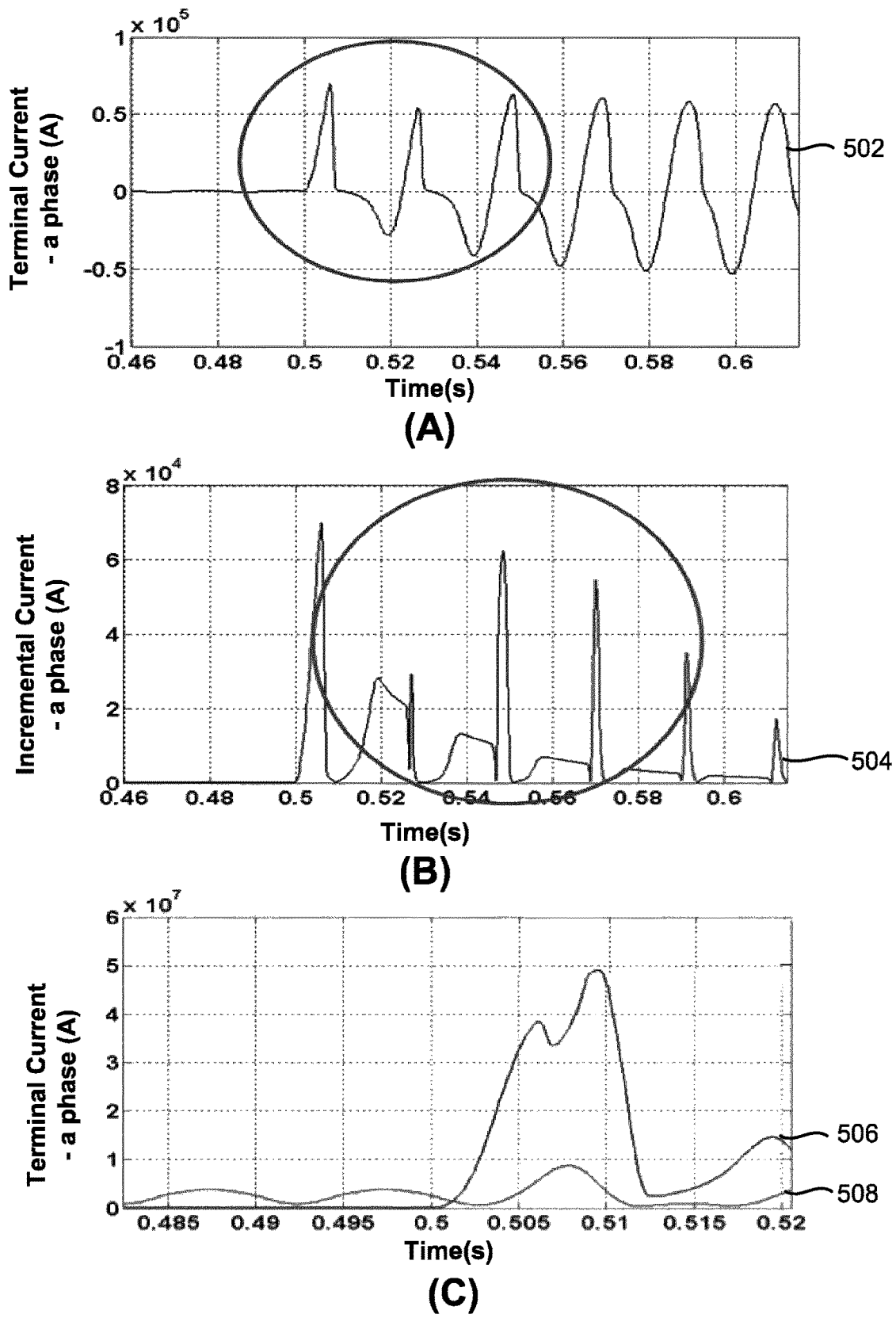

In one embodiment, proposed method is tested with special examples such as CT saturation, power swing, faults during power swing, and the like. These and other aspects are further described in detail in conjunction with the accompanying FIGS. 5-7. In one example, considering a fault scenario under CT saturation. FIG. 5 shows the performance of the proposed algorithm for a fault example with CT saturation. The test example has a fault at 2% of the line (4 km for a 200 km line) with low fault resistance of 0.1 ohm. Typically, FIG. 5A shows the terminal current measured at local terminal A as shown in waveform 502, FIG. 5B shows incremental quantity of the current as shown in waveform 504, and FIG. 5C made comparison of actual rate of change of current with threshold as shown in waveforms 506 and 508 respectively. It can be seen from both the waveforms that the fault current is as high as 10 kA and CT has saturated (encircled portions of the waveforms as depicted in FIG. 5B).

Figure 6:
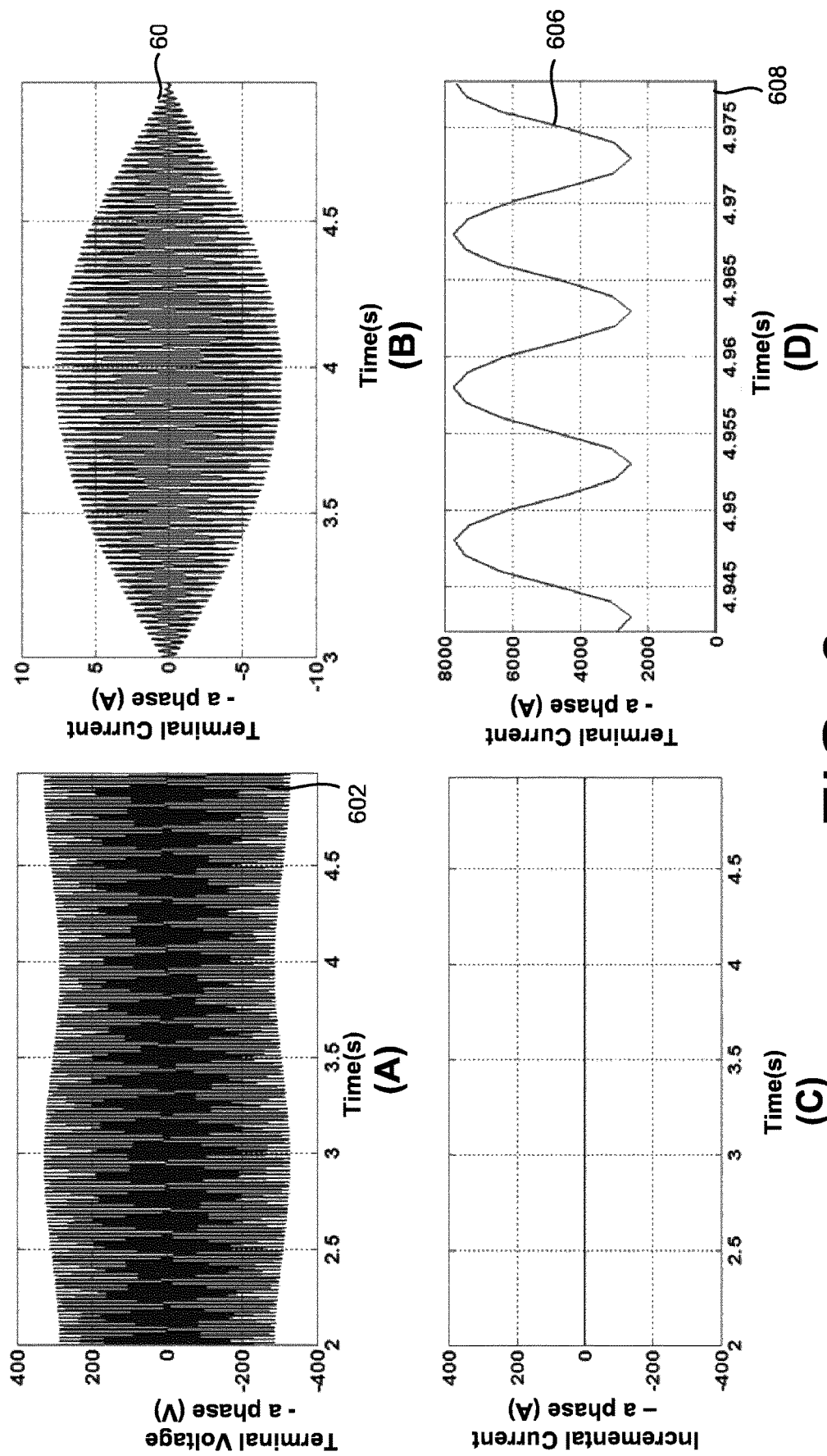
Figure 7:
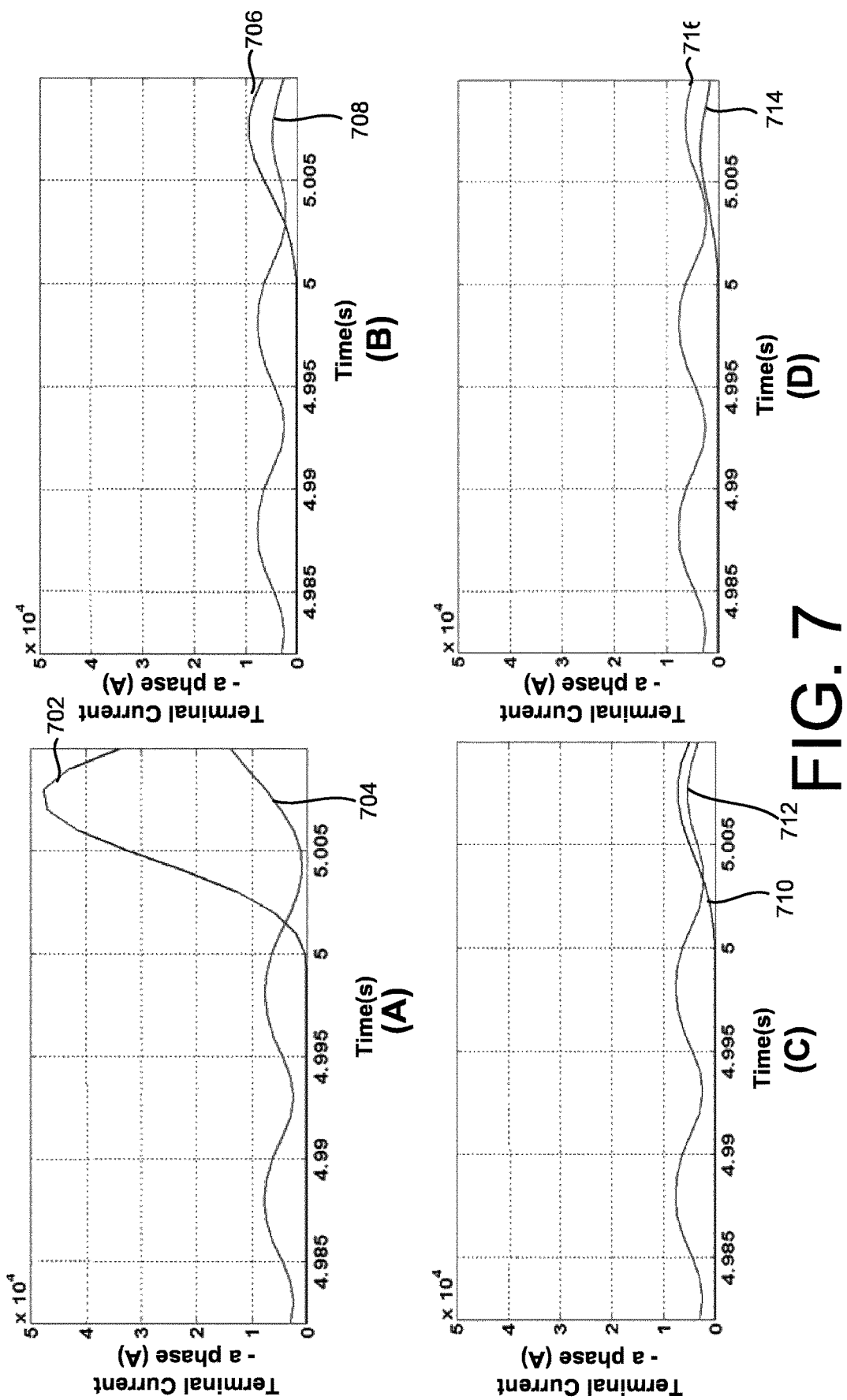

In another example, fault detection within a zone which may occur during a power swing. FIG. 6 shows the corresponding waveforms depicting during power swing. Typically, FIG. 6A shows terminal voltage during power swing as shown in waveform 602, FIG. 6B shows terminal current during power swing as shown in waveform 604, FIG. 6C shows incremental current 220 during power swing, and FIG. 6D shows comparison between the actual rate of change of incremental current 222 with threshold for the rate of change of incremental current 224 as shown in waveforms 606 and 608 respectively. As it can be observed from the waveforms, the rate of change of current does not cross the threshold and hence the distance element does not operate. In yet another example, a Power Swing Block function (e.g., as implemented by the IED 110), blocks distance relay to prevent operation during power swings. However, if a fault occurs during a power swing, distance protection of transmission lines is to operate reliably. FIG. 7 shows the corresponding waveforms depicting faults detected during power swing. Currently, an unblocking function is used to detect faults during power swing and unblock distance relay. The proposed solution as explained in previous section does not require any blocking during power swings. It works accurately for faults during power swing, as shown in various waveforms of FIG. 7.

For an instance, FIG. 7A shows fault location to be identified within 20 kms on a 200 kms transmission line. In one example, fault inception time to be 5 seconds as shown in waveform 702 and detection time to be approximately 5.002 sec, as shown in waveform 704. Such an analysis further indicates the fault to be present within the monitored zone. It may be noted that experimental graph of FIG. 7A was captured within 2 ms after occurrence of the fault. FIG. 7B shows fault location to be identified within 100 kms on a 200 kms transmission line. In one example, fault inception time to be 5 seconds as shown in waveform 706 and detection time to be approximately 5.003 sec, as shown in waveform 708. Such an analysis also indicates the fault to be present within the monitored zone. It may be noted that experimental graph of FIG. 7B was captured within 3 ms after occurrence of the fault.

FIG. 7C shows fault location to be identified within 128 kms on a 200 kms transmission line. In one example, fault inception time to be 5 seconds as shown in waveform 710 and detection time to be approximately 5.003 sec, as shown in waveform 712. Such an analysis also indicates the fault to be present within the monitored zone. It may be noted that experimental graph of FIG. 7C was captured within 3 ms after occurrence of the fault. FIG. 7D shows fault location to be identified within 128 kms on a 200 kms transmission line. In one example, fault inception time to be 5 seconds as shown in waveform 714 and detection time to be almost negligible, as shown in waveform 716. Such an analysis indicates the fault to be present outside the monitored zone. Hence, this solution can potentially eliminate the need for power swing blocking or unblocking of zone-1 distance relay.

Figure 8:
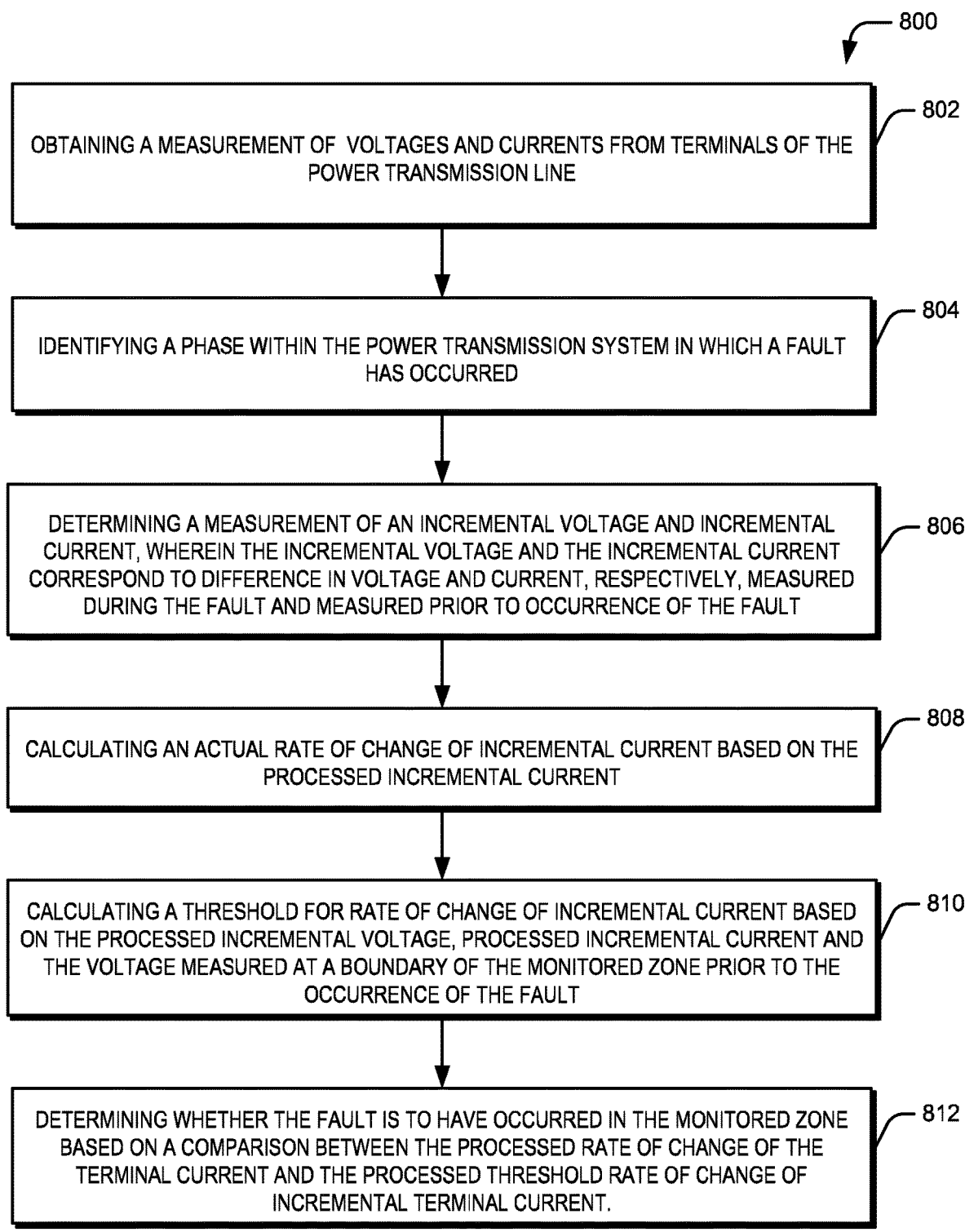
FIG. 8 provides a flow diagram depicting an example method for ascertaining the presence of a fault within a monitored zone of a power transmission line within an electrical network.

FIG. 8 illustrates a flowchart of a method 800 for detecting occurrence of electrical fault within a monitored zone of a power transmission line in a power transmission system, in accordance with one implementation of the present subject matter. The order in which the methods are described is not intended to be construed as a limitation, and any number of the described method blocks may be combined in any order to implement the methods, or an alternative method. Furthermore, method 800 may be implemented by processing resource through any suitable hardware, non-transitory machine-readable instructions, or combination thereof.

At block 802, the IED 110 receives a measurement of a pre-fault loop voltage 214 and a pre-fault loop current 216. In one example, the measurements of the pre-fault loop voltage 214 and the pre-fault loop current 216 may correspond to initial values of current and voltage obtained from one end of the power transmission line.

At block 804, the IED 110 identifies an occurrence of fault within a particular phase. In one example the loop identification in a particular phase may correspond to each phase of one of a three-phase electric current or a three-phase electric voltage. The occurrence of the fault in a loop may be identified based upon pre-determined conditions, as expressed earlier in equations (19)-(33). Upon detection of fault, a trip signal may be generated.

At block 806, the IED 110 determines a measurement of an incremental voltage 218 and an incremental current 220. In one example, the incremental voltage 218 and the incremental current 220 may correspond to difference in voltage and current, respectively, measured during the fault and/or measured prior to occurrence of the fault. An equation based on such a determination is expressed earlier in equations (34)-(35).

At block 808, the IED 110 calculates an actual rate of change of incremental current 222 based on a processed incremental current. The processed incremental current is based on the incremental current 220. In one example, the processed incremental current is measured at a boundary of the monitored zone prior to the occurrence of the fault. An equation based on which the processed incremental current and the actual rate of change of incremental current 222 is determined is expressed earlier in equations (36)-(41).

At block 810, the IED 110 further calculates a threshold for the rate of change of incremental current 224 based on the processed incremental voltage. In one example, the processed incremental voltage is measured at a boundary of the monitored zone prior to the occurrence of the fault. An equation based on which the threshold for the rate of change of incremental current 224 is determined, is expressed earlier in equation (42)

At block 812, the IED 110 further determines whether the fault is to have occurred in the monitored zone based on a comparison between a processed rate of change of incremental current 226 and the processed threshold for the rate of change of incremental current 228. In one example, if the processed rate of change of the incremental current 226 is greater than the processed threshold for the rate of change of incremental current 228, then the fault detection module 114 indicates occurrence of the fault within the monitored zone. Conversely, when the processed rate of change of the incremental current 226 is lesser than the processed threshold for the rate of change of incremental current 228, the fault detection module 114 identifies occurrence of the fault outside the monitored zone. The equations based on which the processed rate of change of incremental current 226 and the processed threshold for the rate of change of incremental current 228 is determined, is expressed as equations (43)-(44).

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter

We claim:

1. A method for protecting a power transmission line in response to a fault within a monitored zone in a power transmission system, the method comprising:
    identifying an occurrence of a fault in at least one phase of a power transmission line;
    calculating an actual rate of change of incremental current based on calculated incremental currents;
    calculating a threshold for rate of change of incremental current based on calculated incremental voltages, the calculated incremental currents, line parameters, and a zone setting for the monitored zone;
    determining the fault to be in the monitored zone based on comparison of the actual rate of change of incremental current and the threshold for the rate of change of incremental current; and
    generating a trip signal for controlling a switching device associated with the power transmission line, based on the comparison.

2. The method as claimed in claim 1, wherein the calculated incremental voltages and the calculated incremental currents correspond to difference in voltages and currents, respectively, wherein the voltages and currents are measured at terminals of the power transmission line.

3. The method as claimed in claim 2, wherein calculating the actual rate of change of incremental current further comprises:

processing, based on a moving average filter, the calculated incremental currents to provide processed incremental currents; and calculating the actual rate of change of incremental current based on the processed incremental currents.

4. The method as claimed in claim 2, wherein identifying the occurrence of the fault in at least one phase is based on the calculated incremental currents associated with one terminal of the power transmission line.

5. The method as claimed in claim 1, wherein the line parameters comprise resistance and inductance of the transmission line.

6. The method as claimed in claim 1, wherein determining the fault further comprises:

calculating a root-mean-square value of the actual rate of change of the incremental current and the threshold for the rate of change of incremental current to provide a processed actual rate of change of incremental current and a processed threshold for the rate of change of incremental current; and comparing a processed actual rate of change of incremental current and a processed threshold for the rate of change of incremental current.

7. The method as claimed in claim 6, wherein the fault is to have occurred when the processed actual rate of change of incremental current to be greater than the processed threshold for the rate of change of incremental current.

8. A method for protecting a power transmission line in response to a fault within a monitored zone in a power transmission system, the method comprising:

identifying an occurrence of a fault in at least one phase of a power transmission line;

calculating an actual rate of change of incremental current based on calculated incremental currents, wherein calculating the actual rate of change of incremental current comprises processing, based on a moving average filter, the calculated incremental currents to provide processed incremental currents, and calculating the actual rate of change of incremental current based on the processed incremental currents;

calculating a threshold for rate of change of incremental current based on calculated incremental voltages, the calculated incremental currents, line parameters, and a zone setting for the monitored zone;

determining the fault to be in the monitored zone based on comparison of the actual rate of change of incremental current and the threshold for the rate of change of incremental current; and generating a trip signal for controlling a switching device associated with the power transmission line, based on the comparison, wherein a processed incremental voltage and the processed incremental currents are determined using the following equations:

$$\Delta v_{lplma}(k) = \frac{1}{3}\sum_{i=-1}^{1} \Delta v_{lp}(k-i)$$

$$\Delta i_{lplma}(k) = \frac{1}{3}\sum_{i=-1}^{1} \Delta i_{lpl}(k-i)$$

$$\Delta i_{lprma}(k) = \frac{1}{3}\sum_{i=-1}^{1} \Delta i_{lpr}(k-i)$$

$$v_{ma}^{pre}(k) = \frac{1}{3}\sum_{i=-1}^{1} v^{pre}(k-i)$$

$$i_{ma}^{pre}(k) = \frac{1}{3}\sum_{i=-1}^{1} i^{pre}(k-i)$$

wherein, $\Delta v_{lpma}$ is the processed incremental voltage;
$\Delta i_{lplma}$ is the processed incremental current across an inductive component of the transmission line;
$\Delta i_{lprma}$ is the processed incremental current across a resistive component of the transmission line;
$v_{ma}^{pre}$ is a processed pre-fault loop voltage; and
$i_{ma}^{pre}$ is a processed pre-fault loop current.

9. An intelligent electronic device (IED) to protect a power transmission line from a fault which is to have occurred in at least one phase of the power transmission line within a monitored zone in a power transmission system, with the IED being provided at one end of the power transmission line connecting at least two terminals with one or more power transmission line, the IED comprising:

a microprocessor;
an output interface;
a phase selection module to:
detect occurrence of a fault in at least one phase of a power transmission line;
a fault detection module to:
calculate incremental voltages and incremental currents, based on voltages and currents measured at terminals of the power transmission line;
calculate an actual rate of change of incremental current based on calculated incremental currents;
calculate a threshold for the rate of change of incremental current based on calculated incremental voltages, the calculated incremental currents, line parameters, and a zone setting for a monitored zone;
compare the actual rate of change of incremental current and the threshold for the rate of change of incremental current to determine the fault to be in the monitored zone; and
generate a trip signal for controlling a switching device associated with the power transmission line, based on the comparison.

10. The device as claimed in claim 9, wherein calculating the actual rate of change of incremental current comprises processing, based on a moving average filter, the incremental currents to provide processed incremental currents.

11. An intelligent electronic (IED) to protect a power transmission line from a fault which is to have occurred in at least one phase of the power transmission line within a monitored zone in a power transmission system, with the IED being provided at one end of the power transmission line connecting at least two terminals with one or more power transmission line, the IED comprising:

a microprocessor;
an output interface;
a phase selection module to:
detect occurrence of a fault in at least one phase of a power transmission line;
a fault detection module to:
calculate incremental voltages and incremental currents, based on voltages and currents measured at terminals of the power transmission line;
calculate an actual rate of change of incremental current based on calculated incremental currents, wherein calculating the actual rate of change of incremental current comprises processing, based on a moving average filter, the incremental currents to provide processed incremental currents;

calculate a threshold for the rate of change of incremental current based on calculated incremental voltages, the calculated incremental currents, line parameters, and a zone setting for a monitored zone;

compare the actual rate of change of incremental current and the threshold for the rate of change of incremental current to determine the fault to be in the monitored zone; and generate a trip signal for controlling a switching device associated with the power transmission line, based on the comparison, wherein a processed incremental voltage and a processed incremental current are determined using the following equations:

$$\Delta v_{lpma}(k) = \frac{1}{3}\sum_{i=-1}^{1}\Delta v_{lp}(k-i)$$

$$\Delta i_{lplma}(k) = \frac{1}{3}\sum_{i=-1}^{1}\Delta i_{lpl}(k-i)$$

$$\Delta i_{lprma}(k) = \frac{1}{3}\sum_{i=-1}^{1}\Delta i_{lpr}(k-i)$$

$$v_{ma}^{pre}(k) = \frac{1}{3}\sum_{i=-1}^{1} v^{pre}(k-i)$$

$$i_{ma}^{pre}(k) = \frac{1}{3}\sum_{i=-1}^{1} i^{pre}(k-i)$$

wherein, $\Delta v_{lpma}$ is the processed incremental voltage; and
$\Delta i_{lplma}$ is the processed incremental current across an inductive component of the transmission line; and
$\Delta i_{lprma}$ is the processed incremental current across a resistive component of the transmission line; and
$v_{ma}^{pre}$ is a processed pre-fault loop voltage; and
$i_{ma}^{pre}$ is a processed pre-fault loop current.

12. The device as claimed in claim 11, wherein the fault detection module is to calculate the actual rate of change of incremental current using the following equation:

$$d\Delta i_{act}(k) = \frac{(\Delta i_{lplma}(k) - \Delta i_{lplma}(k-1))}{(\Delta t)}$$

wherein, $\Delta i_{lpkma}$ is the processed incremental current across an inductive component of the transmission line; and
$\Delta t$ is the a interval between two consecutive samples.

13. The device as claimed in claim 11, wherein the fault detection module is to calculate the threshold for the rate of change of incremental current using the equation:

$$d\Delta i_{thr}(k) = \frac{\Delta v_{lpma}(k) - R_1 * z_b * \Delta i_{lprma}(k) + v_{z1}^{pre}(k)}{L_1 * z_b}$$

wherein, $\Delta v_{lpma}$ is the processed incremental voltage;
$\Delta i_{lprma}$ is the processed incremental current across a resistive component of the transmission line;
$z_b$ denotes the boundary of the monitored zone;

$R_1$, $L_1$ are positive-sequence series resistance and inductance of the transmission line; and
$v_{z1}^{pre}$ is further determined using the following equation:

$$v_{z1}^{pre}(k) = \Delta v_{lpma}(k) - R_1 * z_b * \Delta i_{lprma}(k) - L_1 * z_b * \frac{(\Delta i_{lplma}(k) - \Delta i_{lplma}(k-1))}{(\Delta t)}.$$

14. The device as claimed in claim 13, wherein the processed rate of change of incremental current and the processed threshold for the rate of change of incremental current are represented as:

$$d\Delta i_{act}^{rms} = \sqrt{\frac{\sum_{i=0}^{\frac{N}{3}}(d\Delta i_{act}(k-i))^2}{\frac{N}{3}}}\ ; \text{and}$$

$$d\Delta i_{thr}^{rms} = \sqrt{\frac{\sum_{i=0}^{N/3}(d\Delta i_{thr}(k-i))^2}{N/3}}$$

wherein $d\Delta i_{act}^{rms}$ depicts the processed actual rate of change of incremental current; and
wherein $d\Delta i_{thr}^{rms}$ depicts the processed threshold for the rate of change of incremental current.

15. The device as claimed in claim 14, wherein the fault detection module determines an occurrence of the fault to be within the monitored zone when the processed rate of change of incremental current is greater than the processed threshold for the rate of change of incremental current.

16. A non-transitory computer-readable medium having instructions stored thereon, wherein the instructions when executed by a processor, cause the processor to:
identify an occurrence of a fault in at least one phase of a power transmission line;
calculate an actual rate of change of incremental current based on calculated incremental currents;
calculate a threshold for rate of change of incremental current based on calculated incremental voltages, the calculated incremental currents, line parameters, and a zone setting for a monitored zone in a power transmission system;
determine the fault to be in the monitored zone based on comparison of the actual rate of change of incremental current and the threshold for the rate of change of incremental current; and
generate a trip signal for controlling a switching device associated with the power transmission line, based on the comparison.

17. The non-transitory computer-readable medium as claimed in claim 16, wherein the calculated incremental voltages and the calculated incremental currents correspond to difference in voltages and currents, respectively, wherein the voltages and currents are measured at terminals of the power transmission line.

18. The non-transitory computer-readable medium as claimed in claim 17, wherein calculating the actual rate of change of incremental current further comprises:
processing, based on a moving average filter, the calculated incremental currents to provide processed incremental currents; and
calculating the actual rate of change of incremental current based on the processed incremental currents.

19. The non-transitory computer-readable medium as claimed in claim 16, wherein the line parameters comprise resistance and inductance of the transmission line.

20. A non-transitory computer-readable medium having instructions stored thereon, wherein the instructions when executed by a processor, cause the processor to:
- identify an occurrence of a fault in at least one phase of a power transmission line;
- calculate an actual rate of change of incremental current based on calculated incremental currents, wherein calculating the actual rate of change of incremental current comprises
  - processing, based on a moving average filter, the calculated incremental currents to provide processed incremental currents, and
  - calculating the actual rate of change of incremental current based on the processed incremental currents;
- calculate a threshold for rate of change of incremental current based on calculated incremental voltages, the calculated incremental currents, line parameters, and a zone setting for a monitored zone in a power transmission system;
- determine the fault to be in the monitored zone based on comparison of the actual rate of change of incremental current and the threshold for the rate of change of incremental current; and
- generate a trip signal for controlling a switching device associated with the power transmission line, based on the comparison, wherein a processed incremental voltage and a processed incremental current is determined using the following equations:

$$\Delta v_{lpma}(k) = \frac{1}{3}\sum_{i=-1}^{1} \Delta v_{lp}(k-i)$$

$$\Delta i_{lplma}(k) = \frac{1}{3}\sum_{i=-1}^{1} \Delta i_{lpl}(k-i)$$

$$\Delta i_{lprma}(k) = \frac{1}{3}\sum_{i=-1}^{1} \Delta i_{lpr}(k-i)$$

$$v_{ma}^{pre}(k) = \frac{1}{3}\sum_{i=-1}^{1} v^{pre}(k-i)$$

$$i_{ma}^{pre}(k) = \frac{1}{3}\sum_{i=-1}^{1} i^{pre}(k-i)$$

wherein, $\Delta v_{lmpa}$ is the processed incremental voltage;
$\Delta i_{plma}$ is the processed incremental current across an inductive component of the transmission line;
$\Delta i_{lprma}$ is the processed incremental current across a resistive component of the transmission line;
$v_{ma}^{pre}$ is a processed pre-fault loop voltage; and
$i_{ma}^{pre}$ is a processed pre-fault loop current.

* * * * *